United States Patent [19]

Jackson

[11] Patent Number: 4,758,802
[45] Date of Patent: Jul. 19, 1988

[54] FRACTIONAL N SYNTHESIZER

[75] Inventor: Thomas Jackson, Hanwell, United Kingdom

[73] Assignee: Plessey Overseas Limited, Ilford, United Kingdom

[21] Appl. No.: 925,631

[22] PCT Filed: Feb. 21, 1986

[86] PCT No.: PCT/GB86/00092
§ 371 Date: Nov. 24, 1986
§ 102(e) Date: Nov. 24, 1986

[87] PCT Pub. No.: WO86/05046
PCT Pub. Date: Aug. 28, 1986

[30] Foreign Application Priority Data
Feb. 21, 1985 [GB] United Kingdom ............... 8504543

[51] Int. Cl.⁴ .............................................. H03L 7/00
[52] U.S. Cl. ........................................ 331/10; 331/17; 375/120
[58] Field of Search ..................... 331/1 A, 10, 14, 16, 331/17, 25; 455/76; 375/120; 364/724, 725

[56] References Cited

U.S. PATENT DOCUMENTS
4,223,389 9/1980 Amada et al. .................... 364/724

FOREIGN PATENT DOCUMENTS
0125790 11/1984 European Pat. Off. .
2026268 1/1980 United Kingdom .

Primary Examiner—Paul Gensler
Assistant Examiner—Robert J. Pascal
Attorney, Agent, or Firm—Michael F. Oglo; Julian C. Renfro

[57] ABSTRACT

A fractional N synthesiser comprising a voltage controlled oscillator for producing an output signal which is afforded to a phase detector via a variable divider to provide a control signal for the voltage controlled oscillator in the presence of a phase difference between a reference signal from a reference source and the signal afforded thereto from the variable divider wherein the synthesiser is provided with first and second accumulators, the arrangement of the accumulators being such that an output signal from the arrangement is provided in which the interpolation sidebands of the first accumulator caused by quantization errors in the first accumulator are cancelled, means being provided for setting the division ratio of the variable divider in dependence upon the output signal.

2 Claims, 3 Drawing Sheets

FRACTIONAL N SYNTHESIZER

BACKGROUND TO INVENTION

The present invention relates to improvements in synthesisers of the fractional N type and in particular, to improvements for cancelling unwanted sidebands produced in such synthesisers when operating in the fractional N mode.

Frequency synthesisers usually comprise a voltage controlled oscillator (VCO) for providing an output signal and arranged in a phase lock loop. In order to adjust the frequency of the output signal of the synthesiser the output signal of the VCO is fed via a variable divider to a phase detector which provides a control signal to the VCO in the presence of a phase difference between a reference signal from a reference source and the output signal from the variable divider. The output frequency of such synthesisers can, however, only be varied as a multiple of the reference signal frequency and it is usually desirable to vary the output frequency in relatively small increments. If the reference signal frequency is reduced in order to produce sufficiently small increments the settling time of the synthesiser may be increased to an extent such that it is impractical for many applications. It has, therefore, previously been proposed to include additional circuitry in the synthesiser to enable operation in the fractional N mode and such synthesisers are generally known as fractional N synthesisers. In a fractional N synthesizer the division ratio N of the variable divider is controlled in multiples of N such that, over a number of cycles of the reference signal, the mean value of the division ratio, termed N mean, is the desired fraction of the division ratio N.

However, the operation of the synthesiser in the fractional N mode usually gives rise to a ripple signal, which in view of the phase lock loop configuration in the synthesiser, produces frequency modulation of the output signal from the voltage controlled oscillator and hence, the output signal has poor spectral purity.

In order to compensate for the ripple signal it has been proposed to include a phase modulator between the variable divider and phase detector of the phase lock loop. The phase modulator is driven with a drive signal in order to provide compensation of the ripple signal. However, accurate compensation of the ripple signal is heavily dependent on the accurate setting of the level of the drive signal to the phase modulator. Previous attempts to use feedback control to correct the level of the drive signal, and thus to provide optimum compensation of the ripple signal, have relied upon the extraction of a ripple rate signal from the control signal for the voltage controlled oscillator. However, the amplitude of the ripple signal is small compared to the amplitude of the control signal of the VCO and hence, it is difficult to control accurately the level of the drive signal for the phase modulator.

At present most fractional-N synthesisers are interpolated using either a single or a double accumulator scheme to obtain sub-reference rate output frequencies. In both cases the accumulators produce a bit stream which is applied to the variable divider. The integral of the bit stream is applied via a D/A converter to the synthesiser phase detector output. The sidebands produced by the interpolation are therefore cancelled leaving the induced frequency shift intact.

The single accumulator scheme works well so long as good tracking between the cancellation waveform and the ripple at the phase detector output is maintained. This is not easily achieved with variations in temperature, ageing and vibration. Also the initial calibration is extremely difficult due to the high sensitivities involved.

The double accumulator scheme produces a more efficient output bit stream which actually spreads out the unwanted interpolation sidebands. This results in a reduction of sideband amplitude at a rate of 20 dB per decade of interpolation over a single accumulator scheme. It achieves this by running two accumulators in a series/parallel arrangement. The two output bit streams are suitably combined to form another more efficient bit stream. Thus the matching of the cancellation waveform is relaxed by an order of magnitude and the problems associated with good tracking are much reduced.

The double accumulator scheme is a sub optimum system because there are additional sidebands present which produce "temporary phase shifts" within the synthesiser. This reduces the performance possible from such a system.

SUMMARY OF INVENTION

An objective of the present invention is to provide a modified dual accumulator system in which the unwanted sidebands due to the first accumulator are cancelled. The synthesiser thus receives only the unwanted interpolation sideband generated by the second accumulator and not those from both accumulators as with known systems.

According to the present invention there is provided a fractional N synthesiser comprising a voltage, controlled oscillator for producing an output signal which is afforded to a phase detector via a variable divider to provide a control signal for the voltage controlled oscillator in the presence of a phase difference between a reference sigal from a reference source and the signal afforded thereto from the variable divider wherein the synthesiser is provided with first and second accumulators, the arrangement of the accumulators being such that an output signal from the arrangement is provided in which the interpolation sidebands of the first accumulator caused by quantisation errors in the first accumulator are cancelled, means being provided for setting the division ratio of the variable divider in dependence upon said output signal.

In a preferred embodiment of the present invention the first and second accumulators are arranged so that the second accumulator is fed with the differential contents of the first accumulator, the arrangement causing the interpolation sidebands of the first accumulator to appear in antiphase at the output of the second accumulator.

BRIEF DESCRIPTION OF THE DRAWINGS

The invention will be described further, by way of example, with reference to the accompanying drawings in which.

DETAILED DESCRIPTION OF DRAWINGS

Figure 1:
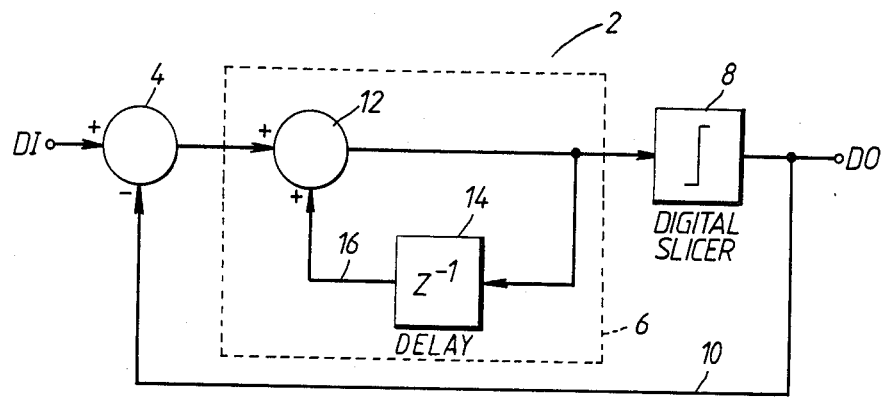
FIG. 1 is a schematic block diagram of a model of a single accumulator system.

Referring to FIG. 1 an accumulator 2 comprises combiner means 4, which may take the form of an X-bit adder, for receiving a digital input D1. The combiner means 4 is connected to a digital controller 6, the output of which is connected to a one bit quantiser in the form of a digital slicer means 8. Feedback means is provided, in the form of a feedback control loop 10, between the output of the slicer 8 and the combiner means 4. The digital controller 6 comprises summing means 12 in combination with a one bit delay 14 in a feedback loop 16.

The output signal Do is presented to the synthesiser's variable divider (not shown) for interpolation.

Figure 2:
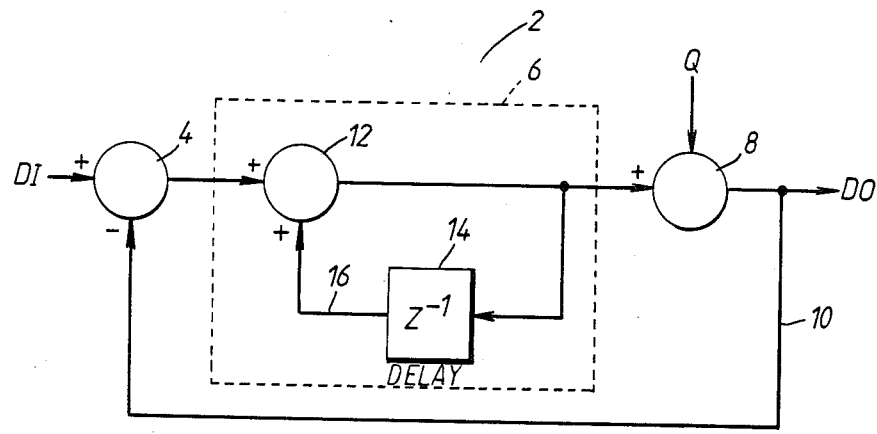
FIG. 2 is a schematic block diagram of a noise model of the system of FIG. 1 incorporating a one bit quantiser.

The contents of the accumulator $V_x$, are appropriately summed at the synthesiser phase detector output via a D/A converter, for sideband cancellation. FIG. 1 shows the block diagram of the operation of the system. If the digital slicer is represented as a one bit quantiser with an associated quantisation error of Q, then the model can be redrawn as shown in FIG. 2. It is the quantisation error Q, which results in the unwanted sidebands.

From inspection:

$$Do(z) = \frac{D1}{2 - z^{-1}} + \frac{Q(1 - z^{-1})}{(2 - z^{-1})}$$

Taking the bilinear transform gives:

$$Do(w) = D1\left(\frac{1 + W}{1 + 3W}\right) + Q\left(\frac{2W}{1 + 3W}\right)$$

in which W has a relationship to Z expressed by $W = az + b/cz + d$ where a, b, c and d are constants The noise sidebands due to Q are actually shaped by a high pass filter characteristic with a slope of 20dB per decade.

Figure 3:
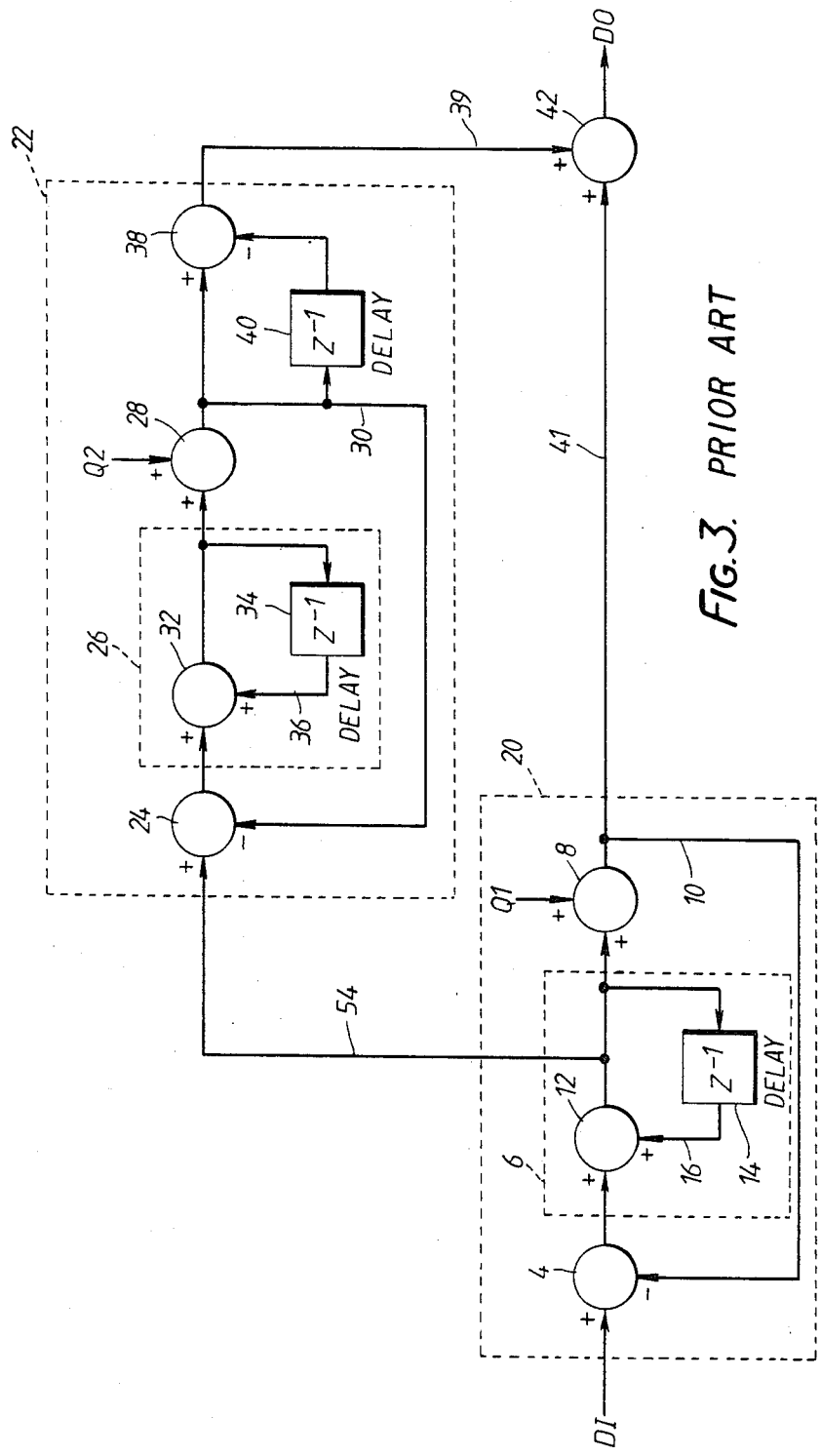
FIG. 3 is a schematic block diagram of a known dual accumulator system.

The known dual accummulator system is shown in FIG. 3.

Referring to FIG. 3 it will be seen that a first accumulator 20 takes the same form as the accumulator in FIG. 2 the same reference numerals having been adopoted. A second accumulator 22 is also provided comprising a combiner means 24 for receiving the output from the summing means 12. The combiner means 24 is connected to a digital controller 26, the output of which is connected to a one bit quantiser in the form of a digital slicer 28. Feedback means is provided, in the form of a feedback loop 30, between the output of the slicer 28 and the combiner means 24. The digital controller 26 comprises a summing means 32 in combination with a one bit delay 34 in a feedback loop 36. The output from the slicer 28 is fed to a combiner means 38 both directly and via a one bit delay 40, the output from the one bit delay 40 being subtractively combined at the combiner means 38 with the output from the one bit delay 40. The output from the combiner means 38 is fed to a combiner means 42 along a line 39 and combined with the output from the first accumulator 20 which is fed to the combiner means 42 along a line 41.

For the dual accumulator analysis shows:

$$Do(z) = \frac{D1(3 + 2z^{-1})}{(2 - z^{-1})^2} + \frac{Q_1(1 - z^{-1})^2}{(2 - z^{-1})^2} + \frac{Q_2(1 - z^{-1})^2}{(2 - z^{-1})}$$

Here it is seen that the noise components due to $Q_1$ and $Q_2$ are shaped by high pass filter characteristics of 40 dB per decade. This results in an unwanted sideband level improvement of 20 dB per decade over the single accumulator system.

Figure 4:
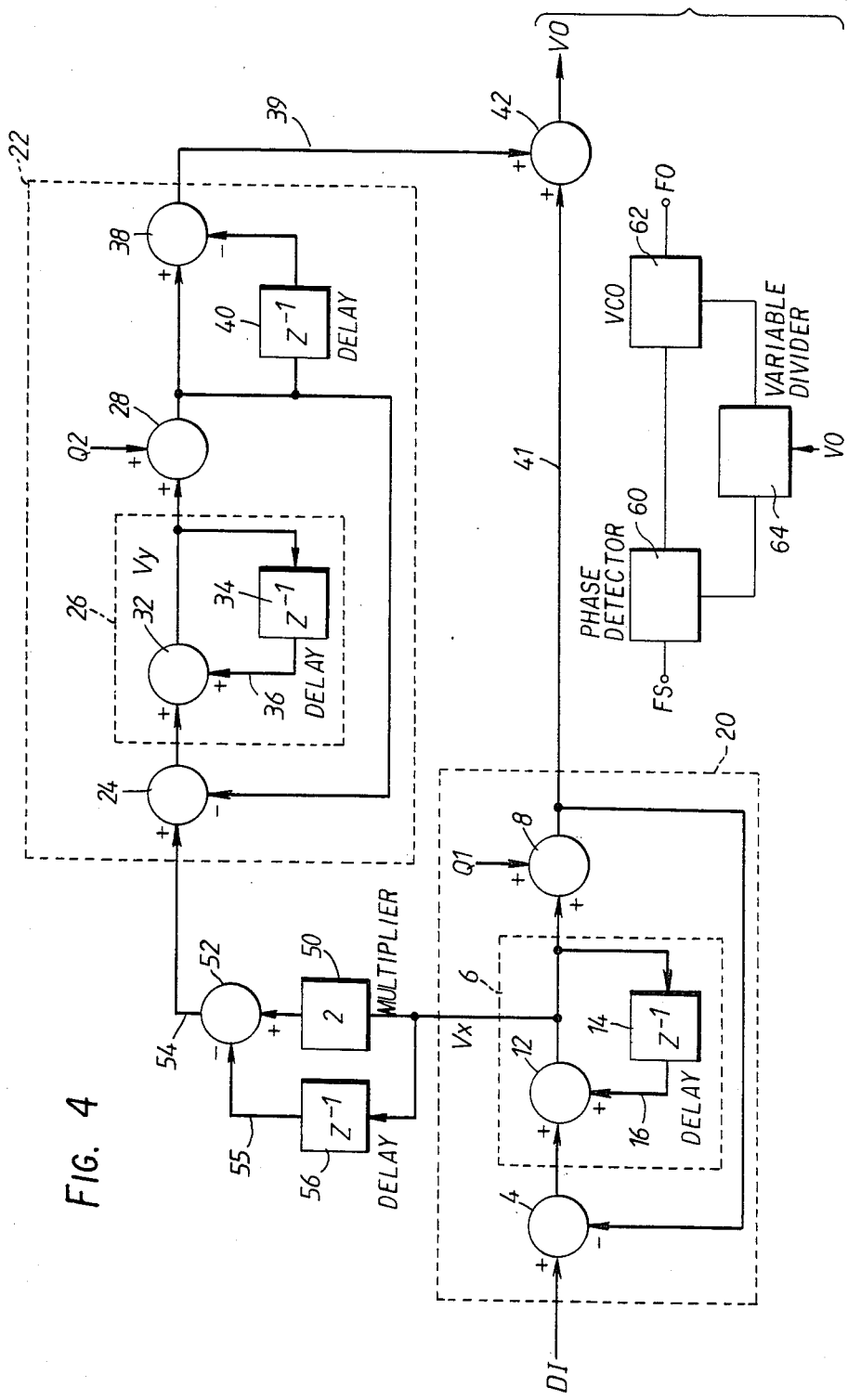
FIG. 4 is a schematic block diagram of a modified dual accumulator system in accordance with one embodiment of the present invention.

The modified dual accumulator system is shown in FIG. 4. The common features of FIG. 3 and FIG. 4 have been identified by identical reference numerals. Referring to FIG. 4 there is provided a multiplier 50 and a combiner means 52 in a line 54 connecting the output of the summer 12 to the input of the combiner means 24. A feed forward line 55 is also provided connecting the output of the summer 12 via a one bit delay 56 to the combiner means 52 where the output from the one bit delay 56 is subtractively combined with the output from the multiplier 50. The multiplier 50 has a multiplier factor of 2.

For the modified dual accumulator analysis shows:

$$Do(z) = D_1 + Q_2 \frac{(1 - z^{-1})^2}{(2 - z^{-1})}$$

Here it is seen that a 20 dB per decade improvement also results over the first accumulator. However the output sequence Vo(z) is more efficient than the known system because no noise due to $Q_1$ exists in the interpolation bit stream.

As shown in the small insert in FIG. 4 the output voltage Vo is presented to a variable divider 64 in the feedback loop between a voltage controlled oscillator 62 and a phase detector 60

When Vo(z) is presented to the variable 64 divider, the phase detector 60 in effect integrates the components due to Vo(z), such that the components at the output of the phase detectors are:

$$\phi_0 = K_\phi \left( \frac{D_1}{1 - z^{-1}} + \frac{Q_2(1 - z^{-1})}{2 - z^{-1}} \right)$$

where $K_0$ is the phase detector gain.

If the contents of the second accumulator are subtracted from the contents of the first then:

$$Vx - Vy = \frac{Q_2}{2 - z^{-1}}$$

which are the unwanted sideband components. If they are differentiated then the term becomes:

$$V_c = \frac{Q_2(1 - z^{-1})}{2 - z^{-1}}$$

Applying this in antiphase at the output of the phase detector exactly cancels the unwanted sidebands due to interpolation.

In the present invention a modified dual accumulator system is proposed which has superior performance to the known systems. This is achieved by increasing the dynamic range of the second accumulator and feeding it with the differentiated contents of the first accumulator.

This results in the interpolation sidebands of the first accumulator appearing in anti-phase in the output bit stream of the second accumulator. When the two bit streams are recombined, all the sidebands due to the first accumulator are automatically cancelled and so do not appear at the synthesiser. A more efficient interpolatng bit stream is thus achieved.

The present invention therefore may be employed to avoid the use of "temporary phase shifts". Greater improvement is achieved by the use of "temporary frequency shifts" which result in complete cancellation of the first accumulator sideband before the sequence is presented to the synthesiser. The synthesiser thus receives only the unwanted interpolation sideband generated by the second accumulator and not those from both as with the known system.

A novel feature of the present invention is a system whereby the introduction of "temporary frequency shifts" result in the internal cancellation of all unwanted sidebands due to the first accumulator.

Although the present invention has been described with respect to a particular embodiment, it should be understood that modifications may be effected within the scope of the invention.

I claim:

1. A fractional N synthesiser comprising a voltage controlled oscillator for producing an output signal which is afforded to a phase detector via a variable divider to provide a control signal for the voltage controlled oscillator in the presence of a phase difference between a reference signal from a reference source and the signal afforded thereto from the variable divider, the synthesiser being provided with first and second accumulators, the first and second accumulators each having a combiner means for receiving a digital input, a digital controller the input of which is connected to the output of the combiner means, a digital slicer means the input of which is connected to the output of the digital controller, and feedback means between the output of the digital slicer means and the combiner means, second combiner means being provided for combining the outputs of the first and second accumulators, wherein the improvement lies in the provision of a multiplier the input of which is connected to the output of the digital controller of the first accumulator, a third combiner means connected between the output of the multiplier and the input of the second accumulator, second feedback means connected between the input to the multiplier and the third combiner means and a delay means in the second feedback means, whereby in operation an output signal from the second combiner means is provided in which the interpolation sidebands of the first accumulator caused by quantisation errors in the first accumulator are cancelled, and means being provided for setting the division ratio of the variable divider in dependence upon said output signal from the second combiner means.

2. A fractional N synthesiser as claimed in claim 1 wherein the output of the delay means is subtractively combined at the third combiner means with the output of the multiplier, the multiplier and the bit delay of the delay means being arranged so that the second accumulator is fed with the differential contents of the first accumulator, the interpolation sidebands of the first accumulator appearing in antiphase at the output of the second accumulator.

* * * * *